(12) United States Patent
Butendeich et al.

(10) Patent No.: US 10,638,578 B2
(45) Date of Patent: Apr. 28, 2020

(54) METHOD OF OPERATING A SEMICONDUCTOR LIGHT SOURCE, AND SEMICONDUCTOR LIGHT SOURCE

(71) Applicant: OSRAM Opto Semiconductors GmbH, Regensburg (DE)

(72) Inventors: Rainer Butendeich, Sinzing (DE); Stefan Illek, Donaustauf (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/068,200

(22) PCT Filed: Feb. 7, 2017

(86) PCT No.: PCT/EP2017/052649
§ 371 (c)(1),
(2) Date: Jul. 5, 2018

(87) PCT Pub. No.: WO2017/140534
PCT Pub. Date: Aug. 24, 2017

(65) Prior Publication Data
US 2019/0021150 A1 Jan. 17, 2019

(30) Foreign Application Priority Data
Feb. 15, 2016 (DE) .......... 10 2016 102 596

(51) Int. Cl.
*H05B 45/20* (2020.01)
*H01L 25/075* (2006.01)
(Continued)

(52) U.S. Cl.
CPC .............. *H05B 45/20* (2020.01); *F21K 9/00* (2013.01); *H01L 25/0753* (2013.01); *H05B 33/08* (2013.01); *F21Y 2115/10* (2016.08)

(58) Field of Classification Search
CPC .......... H05B 33/0857; H05B 33/0845; H05B 33/08; H05B 37/0272; H05B 33/0827;
(Continued)

(56) References Cited

U.S. PATENT DOCUMENTS 6,661,029 B1 12/2003 Duggal
8,096,675 B1 1/2012 Posselt
(Continued)

FOREIGN PATENT DOCUMENTS

DE 10 2004 057 499 A1 7/2005
DE 10 2006 030 890 B4 5/2007
(Continued)

OTHER PUBLICATIONS

CIE Technical Report: Method of Measuring and Specifying Colour Rendering Properties of Light Sources, ISBN 3 900 734 57 7, 1995.
(Continued)

*Primary Examiner* — Renan Luque
(74) *Attorney, Agent, or Firm* — DLA Piper LLP (US)

(57) ABSTRACT

A method of operating a semiconductor light source, wherein the semiconductor light source includes at least one first light source that generates blue light; at least one second light source that generates bluish-white light; at least one third light source that produces greenish-white light; at least one fourth light source that generates red light, wherein no further light sources are present, the light sources can be controlled independently of one another, the light sources are operated in a continuous wave mode and not by pulse width modulation, and the semiconductor light source is operated such that all in all white mixed light having a tunable correlated color temperature is generated, and each of the light sources is operated exclusively with at least 5% of an intended maximum current in the switched-on state of
(Continued)

the semiconductor light source so that an undercurrent operation of the light sources is prevented.

13 Claims, 8 Drawing Sheets

(51) Int. Cl.
  *H05B 33/08* (2020.01)
  *F21K 9/00* (2016.01)
  *F21Y 115/10* (2016.01)
(58) Field of Classification Search
  CPC ....... H05B 33/0815; H05B 45/20; F21K 9/00; H01L 25/0753; F21Y 2115/10; F21Y 2113/13; H04W 4/80; F21S 8/04; F21V 23/0435; F21V 23/045; F21V 23/023; F21V 23/009; H02M 3/24
  See application file for complete search history.

(56) References Cited

U.S. PATENT DOCUMENTS

| | | | |
|---|---|---|---|
| 8,928,023 B1 | 1/2015 | Coleiny et al. | |
| 9,924,574 B1* | 3/2018 | Fernandez | H05B 33/0812 |
| 10,165,635 B1* | 12/2018 | Bradford | H05B 45/20 |
| 2006/0001381 A1* | 1/2006 | Robinson | H05B 33/0815 315/185 R |
| 2006/0017402 A1* | 1/2006 | McKinney | H05B 33/0818 315/291 |
| 2007/0164928 A1* | 7/2007 | Lee | G09G 3/3413 345/30 |
| 2009/0184616 A1* | 7/2009 | Van De Ven | H05B 33/086 313/1 |
| 2009/0302779 A1 | 12/2009 | McKinney | |
| 2010/0110672 A1 | 5/2010 | Durand et al. | |
| 2010/0289727 A1 | 11/2010 | Miller et al. | |
| 2011/0279015 A1* | 11/2011 | Negley | H05B 33/0857 313/501 |
| 2012/0187863 A1* | 7/2012 | Nonaka | H05B 33/0815 315/291 |
| 2013/0002157 A1* | 1/2013 | van de Ven | H05B 33/0824 315/192 |
| 2013/0063035 A1* | 3/2013 | Baddela | H05B 33/086 315/192 |
| 2013/0082589 A1 | 4/2013 | So et al. | |
| 2013/0320369 A1 | 12/2013 | Gärtner et al. | |
| 2014/0152188 A1* | 6/2014 | Bora | H05B 33/0863 315/210 |
| 2016/0073473 A1* | 3/2016 | Fang | H05B 33/0815 315/224 |
| 2016/0113085 A1* | 4/2016 | Vaananen | H05B 33/0851 315/185 R |
| 2016/0126221 A1* | 5/2016 | Windisch | H01L 25/0753 257/89 |
| 2016/0360589 A1* | 12/2016 | Neudorf | H05B 33/0815 |
| 2018/0132329 A1* | 5/2018 | Yan | H01L 25/0753 |
| 2018/0338355 A1* | 11/2018 | Petluri | A61N 5/0618 |

FOREIGN PATENT DOCUMENTS

| | | |
|---|---|---|
| DE | 10 2012 217 534 A1 | 3/2014 |
| EP | 2 549 330 A1 | 1/2013 |

OTHER PUBLICATIONS

Brand Fortner, "Number By Color, Part 5," Scitech Journal, May 1996, pp. 30-33.
Mike Wood, "Out of the Wood: MacAdam ellipses," Fall 2010, pp. 15-18.

* cited by examiner

A)

B)

C)

D)

E)

F)

A)

A)

B)

C)

D)

METHOD OF OPERATING A SEMICONDUCTOR LIGHT SOURCE, AND SEMICONDUCTOR LIGHT SOURCE

TECHNICAL FIELD

This disclosure relates to a method of operating a semiconductor light source and a corresponding semiconductor light source.

Background

There is a need to provide a method with which a semiconductor light source can be precisely controlled with regard to a color locus of an emitted mixed radiation.

SUMMARY

We provide a method of operating a semiconductor light source, wherein the semi-conductor light source includes at least one first light source that generates blue light; at least one second light source that generates bluish-white light; at least one third light source that produces greenish-white light; at least one fourth light source that generates red light, wherein no further light sources are present, the light sources can be controlled independently of one another, the light sources are operated in a continuous wave mode and not by pulse width modulation, and the semiconductor light source is operated such that all in all white mixed light having a tunable correlated color temperature is generated, and each of the light sources is operated exclusively with at least 5% of an intended maximum current in the switched-on state of the semiconductor light source so that an undercurrent operation of the light sources is prevented.

We also provide a semiconductor light source operated according to the method of operating a semiconductor light source, wherein the semiconductor light source includes at least one first light source that generates blue light; at least one second light source that generates bluish-white light; at least one third light source that produces greenish-white light; at least one fourth light source that generates red light, wherein no further light sources are present, the light sources can be controlled independently of one another, the light sources are operated in a continuous wave mode and not by pulse width modulation, and the semiconductor light source is operated such that all in all white mixed light having a tunable correlated color temperature is generated, and each of the light sources is operated exclusively with at least 5% of an intended maximum current in the switched-on state of the semiconductor light source so that an undercurrent operation of the light sources is prevented, including at least one first light source that generates blue light; at least one second light source that generates bluish-white light; at least one third light source that generates greenish-white light; at least one fourth light source that generates red light; and a control unit that independently controls the light sources, wherein the control unit is configured to generate white mixed light with the light sources and operate each light source exclusively with at least 5% of a maximum current so that an undercurrent operation of the light sources is prevented.

We further provide a method of operating a semiconductor light source, wherein the semiconductor light source includes at least one first light source that generates blue light; at least one second light source that generates bluish-white light; at least one third light source that produces greenish-white light; at least one fourth light source that generates red light, wherein no further light sources are present, the light sources can be controlled independently of one another, and the semiconductor light source is operated such that all in all white mixed light having a tunable correlated color temperature (CCT) is generated, and each of the light sources is operated exclusively with at least 5% of an intended maximum current in the switched-on state of the semiconductor light source so that an undercurrent operation of the light sources is prevented.

Figure 1:
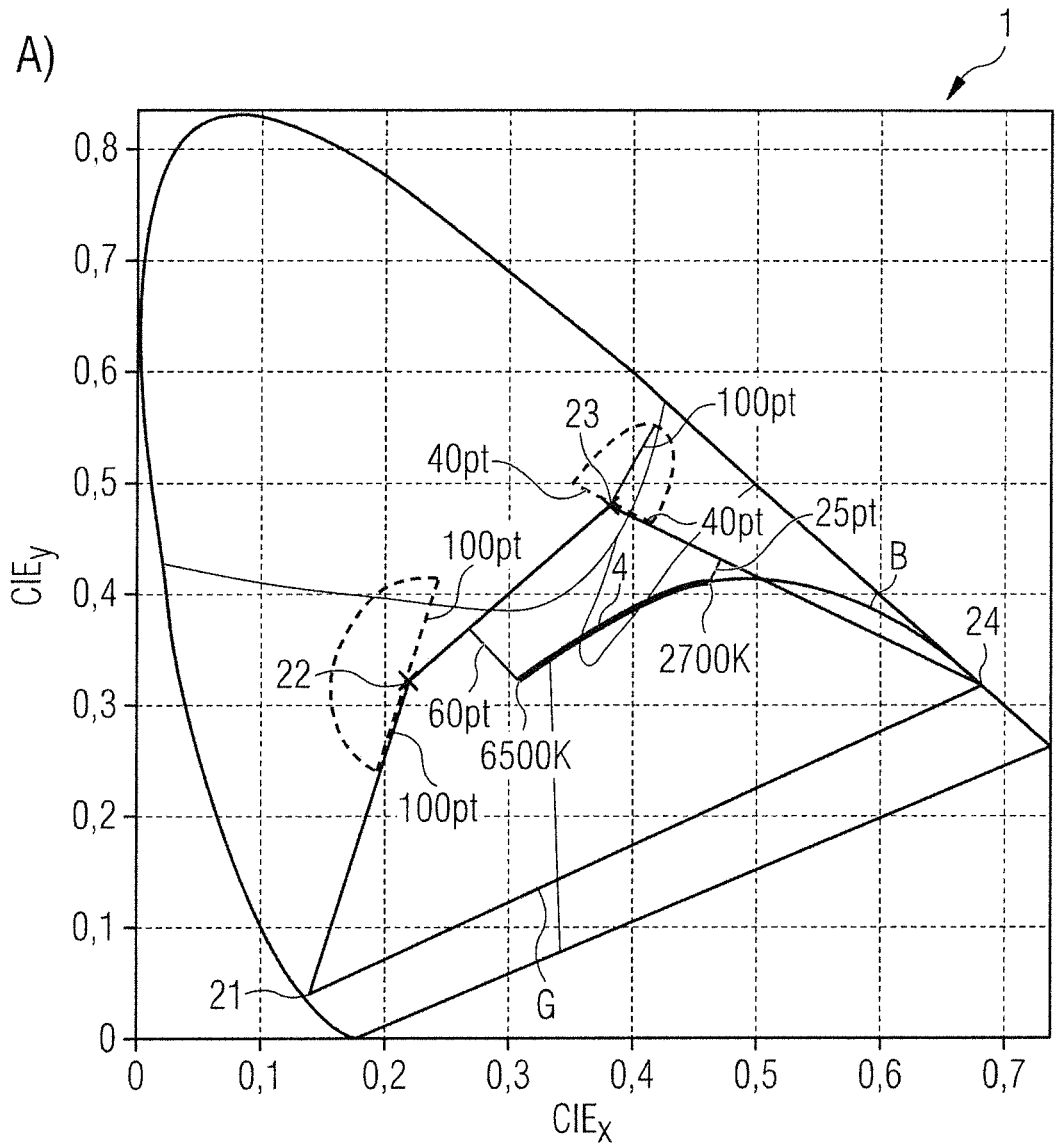
FIGS. 1A-1F show schematic representations of characteristic quantities of a semiconductor light source operated by our method.
Figure 1:
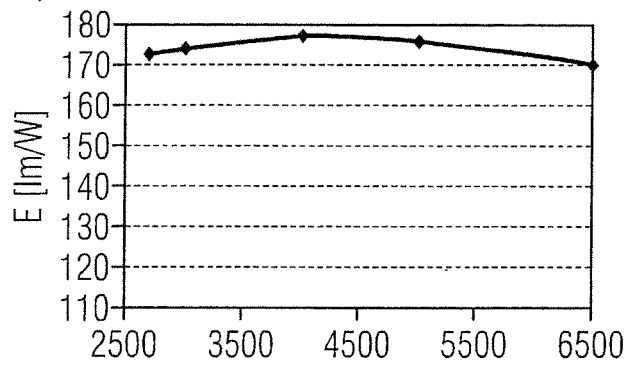
Figure 1:
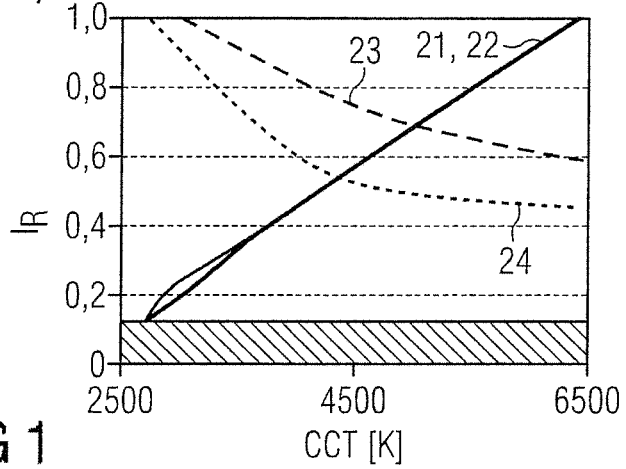
Figure 1:
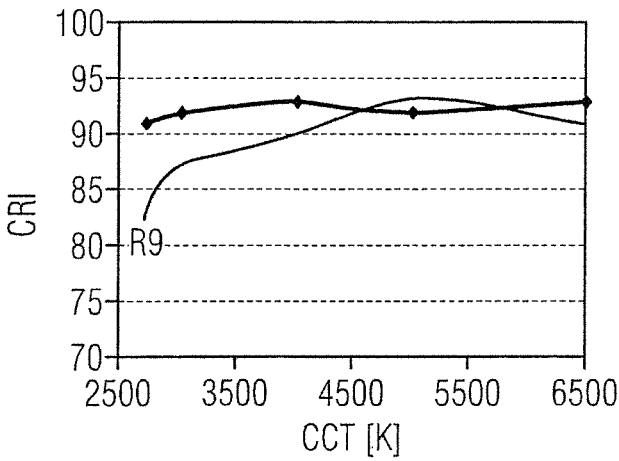
Figure 1:
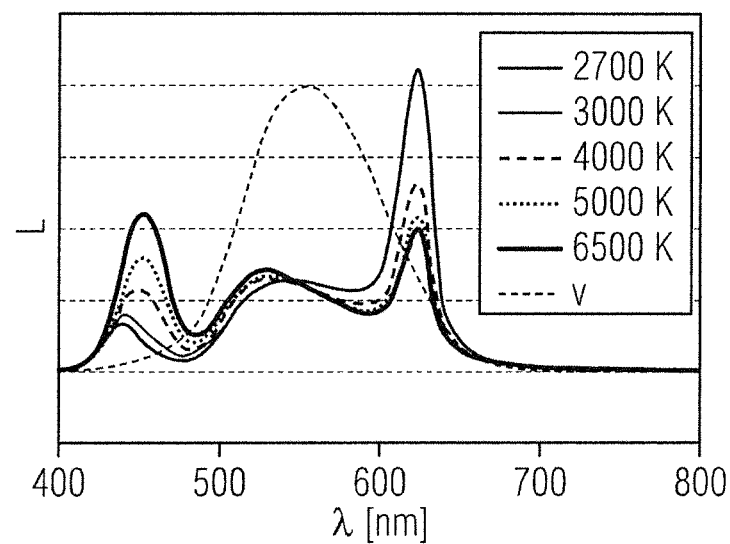
Figure 1:
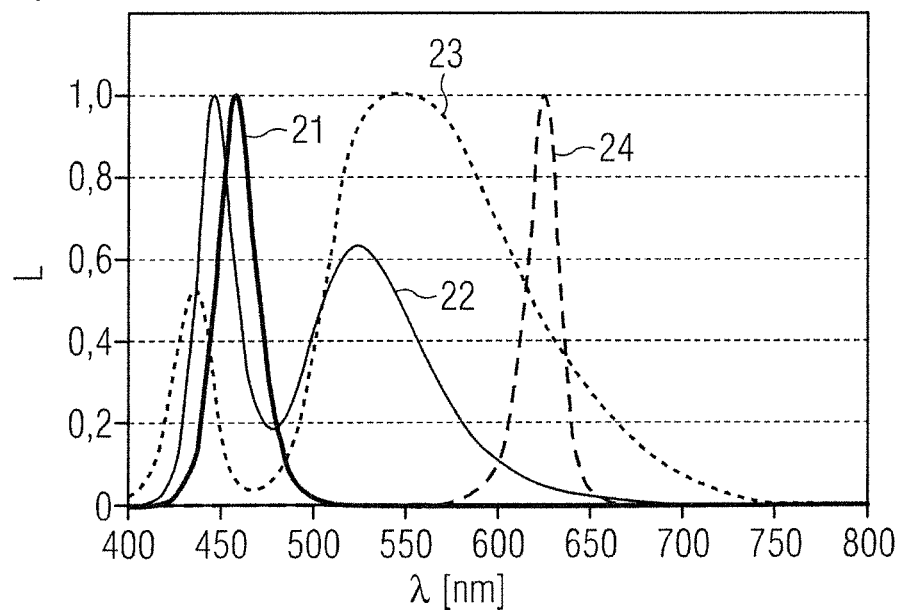

LIST OF REFERENCE SIGNS 1 semiconductor light source
21 first light source for blue light
22 second light source for bluish-white light
23 third light source for greenish-white light
24 fourth light source for red light
3 control unit
4 tuning range
5 support
B black body curve in the CIE xy standard chromaticity diagram
CCT correlated color temperature of the mixed radiation in K
$CIE_x$ x-coordinate in the CIE xy standard chromaticity diagram
$CIE_y$ y-coordinate in the CIE xy standard chromaticity diagram
E efficiency in 1 m/W
G gamut defined by the light sources
$I_R$ relative operating current
λ wavelength in nm
L light intensity
V eye sensitivity curve

DETAILED DESCRIPTION

Our method may be configured to operate a semiconductor light source. 'Semiconductor light source' means that light emitted by the semiconductor light source during operation is predominantly or completely attributed to semiconductor components such as light-emitting diodes or laser diodes. In other words, all light sources of the semiconductor light source can be based on light-emitting diodes and/or on laser diodes.

The semiconductor light source may comprise one or more first light sources. The at least one first light source is configured to generate blue light. In particular, the first light source is formed by one or more light-emitting diodes, in particular structurally identical light-emitting diodes that generate blue light during operation. Unless otherwise stated, terms such as 'blue' relate to the CIE standard chromaticity diagram, see, for example, Brand Fortner, Scitech Journal, May 1996, pages 30 to 33. The disclosure content of that publication is incorporated herein by reference.

The semiconductor light source may comprise one or more second light sources that generate bluish-white light, also referred to as blue-mint. The at least one second light source comprises one or more light-emitting diodes that emit a short-wave radiation, especially blue light, wherein the at least one light-emitting diode has a phosphor or a phosphor mixture that partially converts the short-wave light into longer-wave light, in particular in the green-yellow spectral range.

The semiconductor light source may comprise one or more third light sources. The at least one third light source emits greenish-white light, also referred to as green-mint. Like the second light source, the third light source is formed in particular by one or more light-emitting diodes that emit short-wave, preferably blue, light and to which a phosphor or a phosphor mixture is applied. The phosphor or the phosphor mixture of the third light source preferably differs from that of the second light source in respect of a material composition and/or a concentration of the at least one phosphor.

The semiconductor light source may comprise one or more fourth light sources that generate red light. The at least one fourth light source is preferably formed by one or more light-emitting diodes that emit red light. Like the first light source, the fourth light source can be free of phosphors or filters for a wavelength change of the originally generated radiation.

The semiconductor light source may comprise a control unit. In particular, by the control unit, the light sources can be electrically controlled independently of one another. As a result, the light sources are operated with different intensities so that a color locus of a mixed light emitted by the semiconductor light source is tunable.

The semiconductor light source may be operated such that overall white mixed light is generated, composed of light from all four light sources. A correlated color temperature, also referred to as CCT, is tunable. The term 'white light' can mean that a color locus of the mixed light is at a distance from the black body curve in the CIE xy standard chromaticity diagram of at most 0.02 units or 0.015 units or 0.01 units. Alternatively, it is possible for the term to be understood to mean white light as indicated in conjunction with FIG. 10 of the above-mentioned Brand Fortner publication. The color temperature can preferably be tuned to between 2700 K and 6500 K. The tuning can be carried out in discrete steps or, preferably, continuously.

The light sources may be operated such that in the switched-on state of the semiconductor light source, each of the light sources is operated with at least 5% or 10% or 15% of a prescribed maximum current. The respective maximum current corresponds to 100% of the current with which a specific light source is operated in particular by the control unit in the intended operation of the semiconductor light source. This controlling, according to which the light sources are not operated at excessively low currents, takes place in particular on the basis of the control unit. In other words, an operating range for the light sources in which the light sources are operated only with a very low current is avoided. Thus, the light sources in the semiconductor light source are preferably operated continuously, also referred to as continuous wave or cw. Alternatively, it is possible for the light sources to be controlled by pulse width modulation, also referred to as PWM.

Each of the light sources may be operated exclusively with at least 5% or 10% or 15% of a prescribed maximum current in the switched-on state of the semiconductor light source so that an undercurrent operation of the light sources is prevented. This makes it possible to achieve an increased color locus stability in operation of the respective semiconductor light source and over a production lot.

The method may operate a semiconductor light source. The semiconductor light source comprises a first light source that generates blue light, a second light source that generates bluish-white light, a third light source that generates greenish-white light and a fourth light source that generates red light and optionally a control unit. The light sources can be controlled independently of one another and the semiconductor light source is operated such that a total of white mixed light with a tunable correlated color temperature is generated and each of the light sources, in the switched-on state of the semiconductor light source, is operated with at least 5%, particularly preferably at least 10%, of an associated maximum current.

With the method described here, a semiconductor light source can be achieved that emits variably white light with an adjustable color temperature and at the same time a high color rendering quality, wherein a specific color temperature can be controlled in a reproducible and well-defined manner. For this purpose, the semiconductor light source has four color channels that can be individually controlled. The four light sources forming the four color channels span a color space around the desired color locus region on the black body curve in the CIE xy standard chromaticity diagram, also called gamut, which is controlled with regard to efficiency and quality.

Since setting a color temperature in an edge region of the gamut individual channels, in particular channels of opposite edge regions, contribute only very little to the mixed light, such channels would be supplied with only very little current. However, in a highly undercurrent range, light sources such as light-emitting diodes can only be controlled relatively inaccurately since only comparatively poorly defined characteristic curves of a control and regulation exist in this current regime, for example, due to production tolerances.

In our method, this is remedied by expanding the limits of the gamut. This expansion is carried out only to such an extent that the undefined current range for the light sources, for example, values below 10% of the intended maximum operating current, is avoided. As a result, only a small deviation from an efficiency maximum can be achieved and thus a high efficiency with at the same time high color rendering quality and relatively low component complexity.

The correlated color temperature may be adjusted such that a color locus of the mixed light is at a distance of at least 0.01 units or 0.02 units or 0.03 units in the CIE xy standard chromaticity diagram to an edge of the gamut spanned by the light sources. Particularly preferably, this minimum distance is present at a smallest color temperature which is to be set. At the smallest color temperature, this distance is preferably at most 0.04 units or 0.025 units or 0.018 units.

A color locus of the light of the first light source may have a dominant wavelength of at least 455 nm or 460 nm or 465 nm. Alternatively or additionally, the dominant wavelength is at most 480 nm or 475 nm or 470 nm. Optionally, a color saturation of this color locus is at least 85% or 95% or 97%. This means that the color locus of the light of the first light source is close to the spectral locus in the CIE xy standard chromaticity diagram. Unless otherwise stated, the values mentioned here and in the following for the dominant wavelength, the color locus and the color saturation, also referred to as hue, refer to the CIE xy standard chromaticity diagram of 1931.

A dominant wavelength of the light of the fourth light source may be at least 600 nm or 605 nm or 610 nm and/or at most 630 nm or 625 nm or 620 nm. Alternatively or additionally, the color saturation of this color locus is at least 85% or 95% or 97%. The color saturation denotes the percentage distance of this color locus from the white point, relative to a point of intersection of a line through the white point and this color locus with the spectral locus. This intersection point is at the same time the dominant wavelength.

A color locus of the light of the second light source may lie in or on a quadrilateral in the CIE xy standard chromaticity diagram having the following corner points, expressed in $CIE_x/CIE_y$: 0.2/0.25; 0.24/0.42; 0.18/0.38; 0.16/0.3. Alternatively, this color locus lies within the following quadrilateral: 0.22/0.33; 0.24/0.34; 0.21/0.35; 0.2/0.31. Alternatively, this color locus lies within the following quadrilateral: 0.25/0.20; 0.30/0.40; 0.25/0.45; 0.10/0.30.

A color locus of the light of the third light source may lie within the following quadrilateral: 0.35/0.5; 0.42/0.46; 0.43/0.53; 0.38/0.55. Alternatively, the color locus lies in the following quadrilateral: 0.36/0.46; 0.4/0.46; 0.4/0.49; 0.36/0.5.

The first and/or the fourth light source may have an emission spectrum with only one maximum. Preferably, a spectral half-width, also referred to as FWHM, of the corresponding emission spectrum is at most 35 nm or 25 nm or 20 nm. Alternatively or additionally, the spectral half-width is at least 10 nm or 15 nm or 20 nm.

The emission spectrum of the second and/or the third light source may have a plurality of maxima, preferably exactly two maxima. The maximum with the smallest wavelength is preferably at at least 410 nm or 420 nm or 430 nm and/or at most 460 nm or 455 nm or 450 nm. The emission band associated with the respective maximum in the emission spectrum preferably has a spectral half-width of at most 35 nm or 30 nm or 25 nm and/or of at least 10 nm or 15 nm or 20 nm.

The maximum with the greatest wavelength in the emission spectrum of the second and/or the third light source may be at at least 510 nm or 515 nm or 520 nm and/or at most 565 nm or 560 nm or 550 nm. A spectral half-width of the associated emission band is preferably at least 40 nm or 50 nm or 60 nm and/or at most 160 nm or 150 nm or 130 nm.

The two maxima of the emission spectrum of the second light source may lie between the two maxima of the emission spectrum of the third light source. A distance between the two short-wave maxima with respect to one another and/or a distance between the two long-wave maxima with respect to one another is preferably at least 3 nm or 5 nm or 10 nm and/or at most 40 nm or 30 nm or 25 nm.

For the second light source, the maximum at the smaller wavelength may be higher than the maximum at the longer wavelength. This means that a higher intensity then is present at the smaller wavelength, measured in particular in W/nm, than at the greater wavelength.

For the third light source, the maximum at the smaller wavelength may be at a lower maximum intensity than the maximum at the longer wavelength. In other words, the third light source can behave in a different manner with respect to the relative position of the two maxima in the emission spectrum than the second light source.

The mixed radiation emitted all in all by the semiconductor light source may have exactly three maxima. In particular, one maximum lies in the blue spectral range, one maximum lies in the red spectral range, and one less sharply pronounced maximum lies in the green-yellow spectral range. In particular, the maximum in the blue spectral range is at at least 420 nm and/or at most 470 nm, the maximum in the red spectral range is at at least 615 nm and/or at most 640 nm and the maximum in the green-yellow spectral range is at at least 515 nm and/or at most 540 nm. Alternatively or additionally, one of the marginal maxima is an absolute maximum so that the middle one of the three maxima, especially for each provided correlated color temperature, is lower than one or both marginal maxima.

The semiconductor light source may have an efficiency of at least 140 lm/W in the intended tuning range. Such a high efficiency with simultaneously high color rendering quality can be achieved in particular by using the four light sources.

A color rendering index, also referred to as CRI or $R_a$, may be at least 90 and/or at most 95 or 98 over the entire intended tuning range. For a color rendering value for saturated red light, also designated as R9 or $R_a9$, a rendering value across the entire intended tuning range is preferably at least 82, and at correlated color temperatures above 4500 K, preferably at least 90 and/or at most 95. With regard to the color rendering, reference is made to the CIE technical report 13.3 of 1995, ISBN 3 900 734 57 7, the subject matter of which is incorporated herein by reference with regard to the color rendering indices.

The second and the third light sources or the first and the third light sources may be supplied with current synchronously. This can mean that a relative current intensity of the respective light sources over the tuning range of the color temperature of the mixed light remains the same. This means, for example, that the second light source is operated at 60% of a maximum current, too, when the first light source is operated at 60% of a maximum current.

The second and/or the third light source may comprise a cerium-doped garnet and/or a europium-doped orthosilicate as the phosphor. It is likewise possible for phosphors or phosphor mixtures to be used as specified in EP 2 549 330 A1, the subject matter of which with regard to the phosphors is incorporated herein by reference.

Furthermore, we provide a semiconductor light source. The semiconductor light source is operated using a method as specified in connection with one or more of the above-mentioned examples. Features of the method are therefore also disclosed for the semiconductor light source and vice versa.

A method described here and a semiconductor light source described here are explained in more detail below with reference to the drawing on the basis of examples. Identical reference signs indicate the same elements in the individual figures. In this case, however, no relationships to scale are illustrated, but rather individual elements can be represented with an exaggerated size to afford a better understanding.

In FIG. 1A, an example of a semiconductor light source 1 is illustrated in the CIE xy standard chromaticity diagram. The semiconductor light source 1 comprises a first light source 21, a second light source 22, a third light source 23 and a fourth light source 24. The first light source 21 generates blue light, and a color locus of the first light source 21 is approximately 0.14/0.04. The second light source 22 emits bluish-white light with a color locus of approximately 0.22/0.33. The third light source 23 produces greenish-white light having a color locus of approximately 0.38/0.48. Finally, red light having a color locus of approximately 0.67/0.32 is generated by the fourth light source 24.

All four light sources 21, 22, 23, 24 comprise light-emitting diodes, wherein the second light source 22 and the third light source 23 additionally contain a phosphor or a phosphor mixture for partial wavelength conversion. The four light sources 21, 22, 23, 24 can be controlled electrically independently of one another by a control unit 3. See also FIG. 4. Thus, a gamut G is spanned by the light sources 21, 22, 23, 24. In FIG. 1A, semi-ellipses are also drawn as dashed lines. The color loci of the light sources are preferably located on or within these semi-ellipses.

Within the gamut G, there is a tuning region 4 that lies on the black body curve B. The tuning range 4 relates to white light having a correlated color temperature between 6500 K and 2700 K. By the semiconductor light source 1, this tuning region 4 can be reached by driving the light sources 21, 22, 23, 24. In other words, during operation, the semiconductor light source 1 emits mixed light, the color locus of which lies in the tuning range 4 and consists of light from all light sources 21, 22, 23, 24. As a result, a high efficiency E can be achieved over the entire tuning range 4, see also FIG. 1B.

The tuning region 4 does not extend to the boundary of the gamut G. At the highest color temperature, a distance between the tuning region 4 and the boundary of the gamut G is 60 pt, at the lowest color temperature of 2700 K this distance is 25 pt. The unit pt stands for 0.001 units in the CIE xy standard chromaticity diagram. The pt values specified in FIG. 1A preferably apply in each case with a tolerance of at most 50% or 20% or 10% or 5%. As a result of this distance from the boundary of the gamut G, all light sources 21, 22, 23, 24 are operated over the entire tuning range 4 with a relative operating current $I_R$ which is at least 10% of a maximum operating current. See FIG. 1C.

In this case, the relative operating currents $I_R$ run preferably synchronously with respect to the correlated color temperature CCT of the two light sources 21, 22. As a result, it is possible for the light sources 21, 22 to be jointly controlled, as a result of which circuit complexity can be reduced.

FIG. 1D shows that the color rendering index CRI that relates to the first eight CIE test colors and lies between 90 and 95 over the entire tuning range 4. The color rendering index for the ninth CIE test color R9 for saturated red is also continuously greater than 80.

FIG. 1E shows the emission spectra of the semiconductor light source 1 for different color temperatures, wherein a light intensity I is plotted against the wavelength λ. In addition, the eye-sensitivity curve V is drawn as a dashed line. The emission spectrum of the semiconductor light source 1 has three maxima, wherein a respective peripheral maximum is higher than the central maximum.

FIG. 1F shows the individual emission spectra of the four light sources 21, 22, 23, 24, in each case normalized to 1. The light sources 21, 24 each emit approximately monochromatic light. The spectra of the light sources 22, 23 each have a short-wave, narrow-band maximum and a long-wave, spectrally wider maximum. In this case, the maxima of the second light source 22 lie between the two maxima of the third light source 23, which lie further in the short-wave spectral range and in the long-wave spectral range, respectively.

Figure 2:
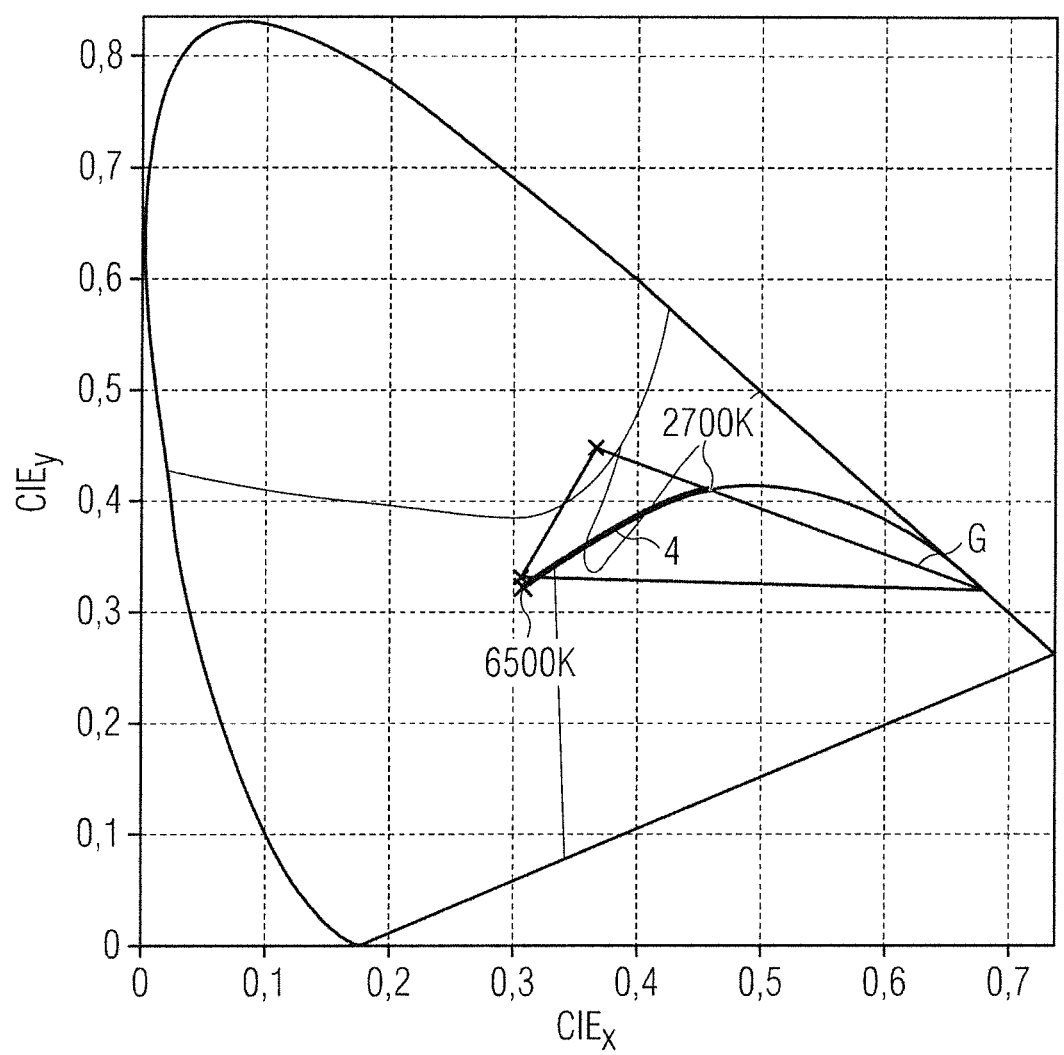
FIGS. 2A-2D and 3A-3D show schematic representations of characteristic quantities of modifications of methods of operating semiconductor light sources.
Figure 2:
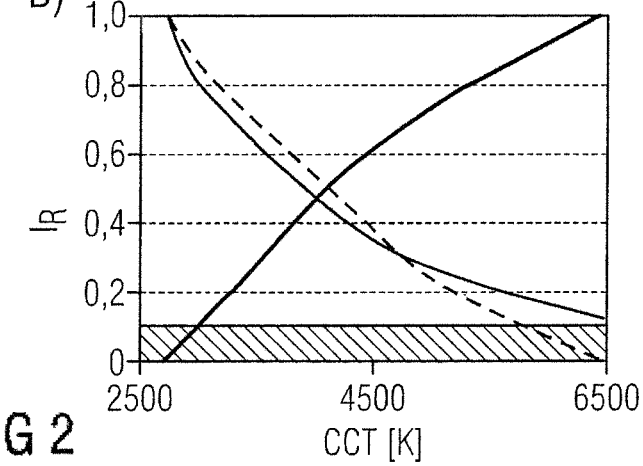
Figure 2:
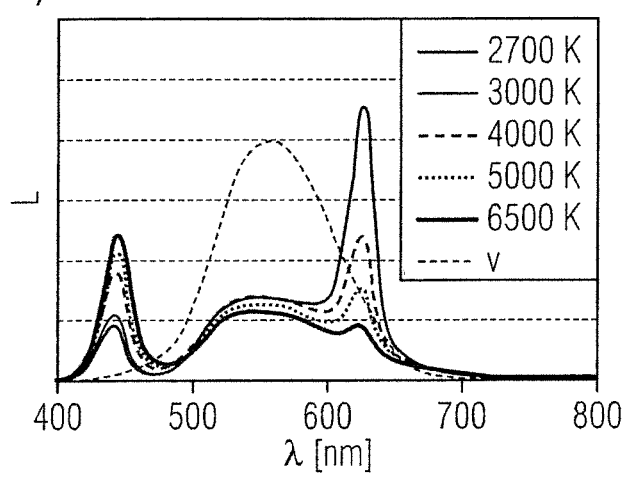
Figure 2:
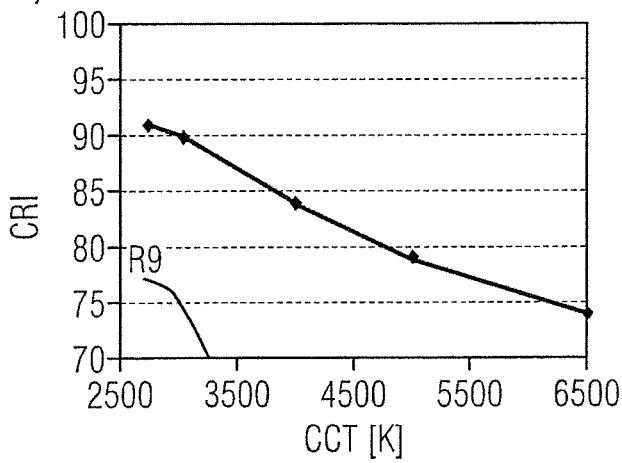

FIG. 2 shows a modification in which only three light sources are present. The representations of FIGS. 2A, 2B, 2C and 2D are analogous to the representations of FIGS. 1A, 1C, 1E and 1D. In this modification, the light sources are partially operated with a relative current intensity $I_R$ of less than 10%. See FIG. 2B. In this region of low currents $I_R$, a reproducibility of a color locus is relatively low. In addition, a color rendering is clearly impaired. See FIG. 2D.

Figure 3:
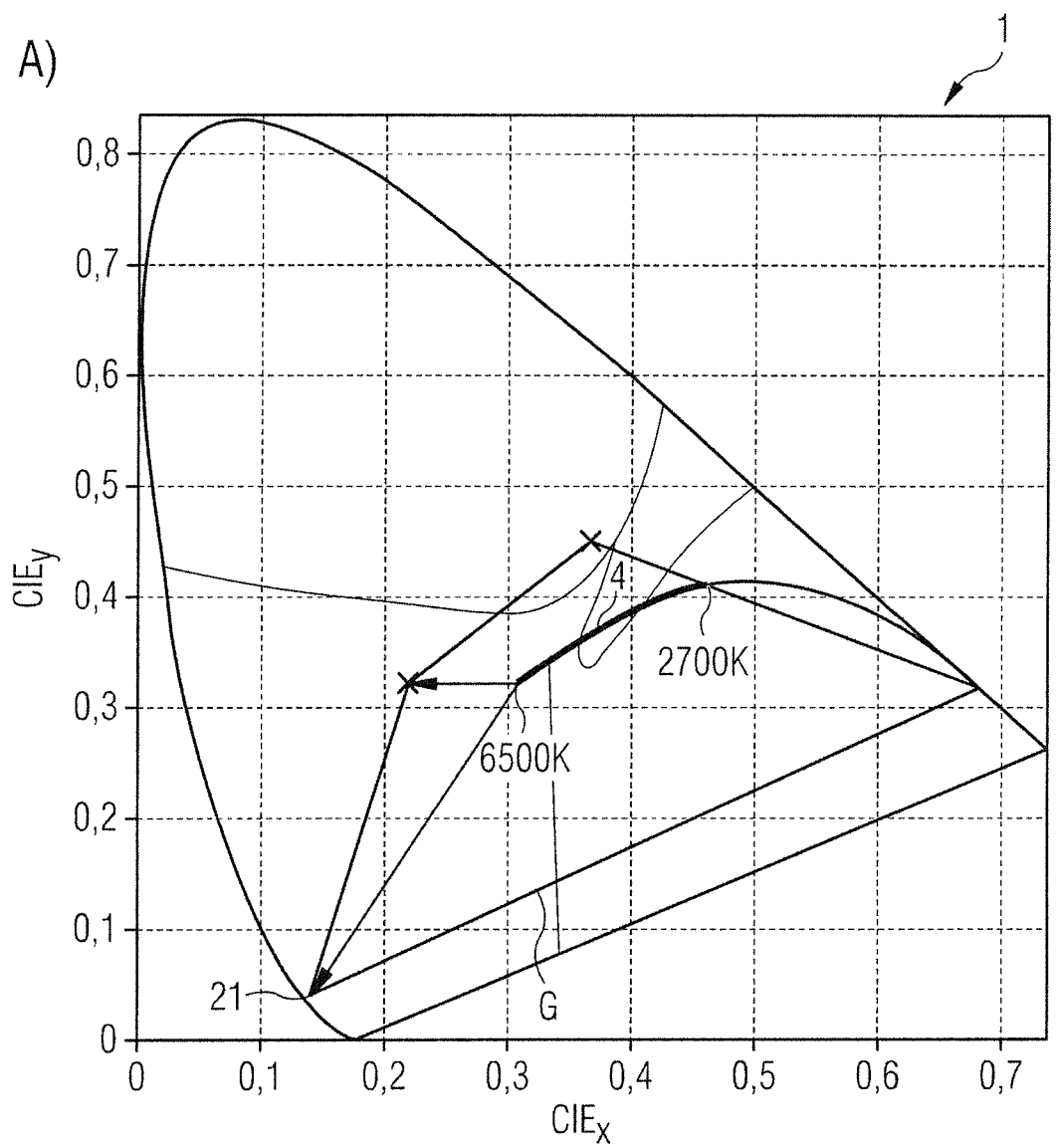
Figure 3:
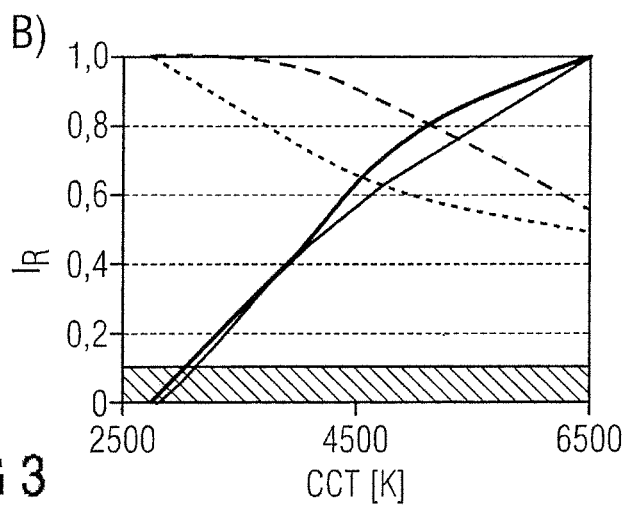
Figure 3:
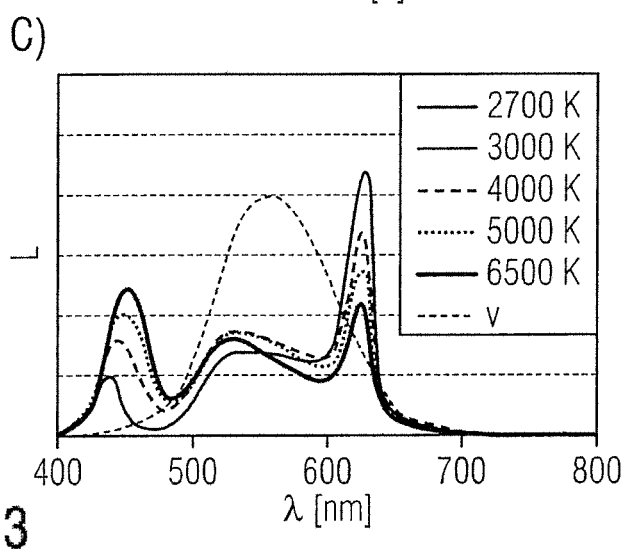
Figure 3:
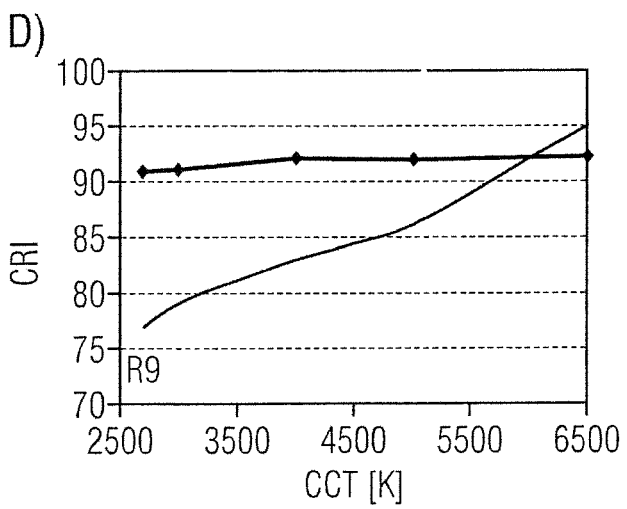

In the modification of FIG. 3, which is analogous to FIG. 2, four light sources are present. However, a tuning range 4 is drawn up to an edge of a gamut G spanned by the four light sources. As a result, the two light sources with the smaller CIE x-coordinate are operated with very low currents $I_R$ for some color loci in the tuning region 4. See FIG. 3B. Furthermore, the color rendering for saturated red R9 at low color temperatures CCT is relatively low. See FIG. 3D.

Figure 4:
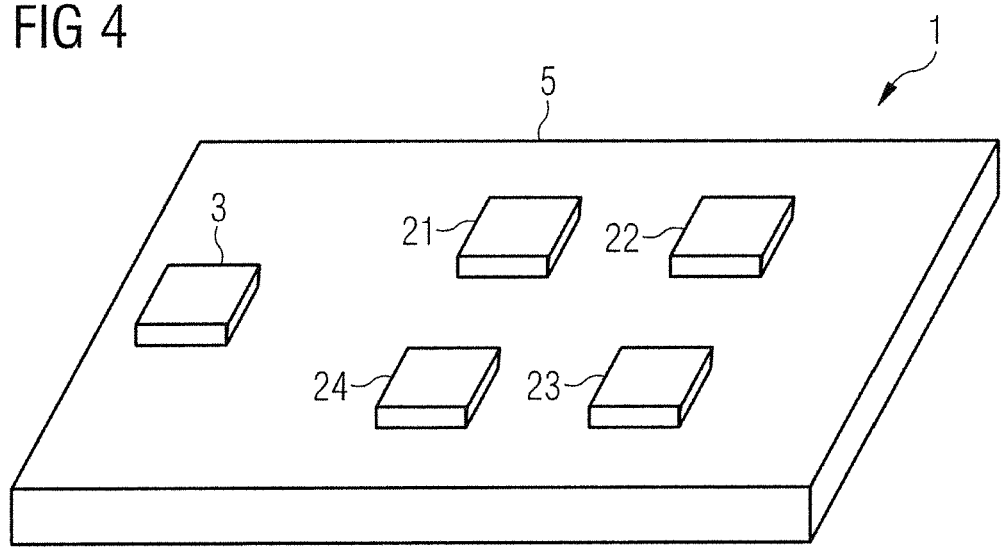
FIG. 4 shows a schematic perspective illustration of an example of our semiconductor light source.

FIG. 4 schematically shows that the light sources 21, 22, 23, 24 of an example of a semiconductor light source 1 are mounted on a common carrier 5. Controlling the light sources 21, 22, 23, 24 takes place via the control unit 3. Electrical interconnections are not shown in FIG. 4 to simplify the illustration. Such interconnections can also be integrated at least partially in the carrier 5, which is preferably designed as a heat sink and/or as a printed circuit board. Further, optionally present components such as lenses, light guides for better light mixing or optical scattering plates are not illustrated.

Our methods and semiconductor light sources are not restricted by the description on the basis of the examples. Rather, this disclosure encompasses any new feature and also any combination of features, which includes in particular any combination of features in the appended claims, even if the feature or combination itself is not explicitly specified in the claims or examples.

This application claims priority of DE 10 2016 102 596.8, the subject matter of which is incorporated herein by reference.

The invention claimed is:

1. A method of operating a semiconductor light source, wherein the semiconductor light source comprises:
    at least one first light source that generates blue light;
    at least one second light source that generates bluish-white light;
    at least one third light source that produces greenish-white light;
    at least one fourth light source that generates red light,
    wherein
    no further light colors are present,
    the light sources are controlled independently of one another,
    the light sources are operated in a continuous wave mode and not by pulse width modulation,
    the semiconductor light source is operated such that all in all white mixed light having a tunable correlated color temperature is generated, and each of the light sources is operated exclusively with at least 5% of an intended maximum current in the switched-on state of the semiconductor light source so that an undercurrent operation of the light sources is prevented,
    a dominant wavelength of the light of the first light source is at least 460 nm and at most 475 nm, a color saturation of the blue light is at least 95%,
    a color locus of the light of the second light source is in or on a quadrilateral in the CIE xy standard chromaticity diagram having corner points expressed in $CIE_x/CIE_y$: 0.22/0.33; 0.24/0.34; 0.21/0.35; 0.2/0.31,
    a color locus of the light of the third light source lies within the quadrilateral; 0.35/0.5; 0.42/0.46; 0.43/0.53; 0.38/0.55, and
    a dominant wavelength of the light of the fourth light source is at least 605 nm and at most 625 nm, a color saturation of the red light is at least 95%.

2. The method according to claim 1, wherein
    the second and the third light sources each have an emission spectrum with exactly two maxima so that the maximum with the smaller wavelength is each 420 nm to 455 nm and has a spectral half-width of at most 30 nm, the maximum with the greater wavelength is each 515 nm to 560 nm and has a spectral half-width of at least 50 nm and at most 150 nm, the two maxima of the second light source lie between the two maxima of the third light source and are each spaced apart from the latter between 5 nm and 30 nm, for the second light source the maximum at the smaller wavelength is higher than the maximum at the longer wavelength, and for the third light source the maximum at the smaller wavelength is lower than the maximum at the longer wavelength.

3. The method according to claim 1, wherein the light sources are continuously operated in the switched-on state without switching into a switched-off state, and the switched-off state is a state with a current less than 5% of the intended maximum current in the switched-on state.

4. The method according to claim 1, wherein the tunable correlated color temperature is adjusted such that a color locus of the mixed light has a distance of at least 0.02 units in a CIE xy standard chromaticity diagram to an edge of a gamut (G) spanned by the light sources.

5. The method according to claim 1, wherein the first and the fourth light sources each have an emission spectrum with only one maximum and with a spectral half-width of at most 30 nm.

6. The method according to claim 1, wherein the second and the third light sources each have an emission spectrum with exactly two maxima so that the maximum with the smaller wavelength is each 420 nm to 455 nm and has a spectral half-width of at most 30 nm, and the maximum with the greater wavelength is each 515 nm to 560 nm and has a spectral half-width of at least 50 nm and at most 150 nm.

7. The method according to claim 6, wherein the two maxima of the second light source lie between the two maxima of the third light source and are each spaced apart from the latter between 5 nm and 30 nm, for the second light source the maximum at the smaller wavelength is higher than the maximum at the longer wavelength, and for the third light source the maximum at the smaller wavelength is lower than the maximum at the longer wavelength.

8. The method according to claim 1, wherein the mixed light has three maxima and one of the respective marginal maxima is an absolute maximum.

9. The method according to claim 1, wherein the semiconductor light source is operated with an efficiency of at least 140 lm/W, and a color rendering index (CRI) and a rendering value for saturated red light (R9) over an entire intended tuning range are at least 82.

10. The method according to claim 1, wherein the tunable correlated color temperature of the mixed light is 2700 k to 6500 k, and a color locus of the mixed light is at a distance from the black body curve (B) in the CIE xy standard chromaticity diagram of at most 0.02 units.

11. The method according to claim 1, wherein the second and third light sources are synchronously supplied with current so that a relative current intensity of the second and third light sources across a tuning range of the tunable correlated color temperature of the mixed light remains the same.

12. The method according to claim 1, wherein at least one of the second and the third light source comprise at least one of a Ce-doped garnet and an Eu-doped orthosilicate as a phosphor.

13. A semiconductor light source operated according to the method of claim 1 comprising:

the at least one first light source that generates blue light;

the at least one second light source that generates bluish-white light;

the at least one third light source that generates greenish-white light;

the at least one fourth light source that generates red light; and a control unit configured to 1) independently control the light sources, and 2)

generate the white mixed light with the light sources and operate each light source exclusively with at least 5% of a maximum current so that an undercurrent operation of the light sources is prevented.

* * * * *